United States Patent [19]
Tseng

[11] Patent Number: 5,677,228
[45] Date of Patent: Oct. 14, 1997

[54] METHOD OF FABRICATING A RESISTOR IN AN INTEGRATED CIRCUIT

[75] Inventor: Horng-Huei Tseng, Hsinchu, Taiwan

[73] Assignee: Vanguard International Semiconductor Corporation, Hsinchu, Taiwan

[21] Appl. No.: 788,679

[22] Filed: Jan. 24, 1997

[51] Int. Cl.⁶ .............................. H01L 21/70; H01L 27/00
[52] U.S. Cl. .......................... 437/60; 437/193; 437/918; 437/203
[58] Field of Search ........................... 437/52, 60, 918, 437/193, 203; 148/DIG. 136

[56] References Cited

U.S. PATENT DOCUMENTS

| | | | |
|---|---|---|---|
| 5,316,978 | 5/1994 | Boyd et al. | 437/60 |
| 5,420,063 | 5/1995 | Maghsoudnia et al. | 437/60 |
| 5,462,894 | 10/1995 | Spinner et al. | 437/60 |

*Primary Examiner*—Jey Tsai
*Attorney, Agent, or Firm*—Christensen, O'Connor, Johnson & Kindness, P.L.L.C.

[57] ABSTRACT

A method for forming a resistor in an integrated circuit is disclosed. The method includes forming a composite mask layer on a substrate, and forming a photoresist layer on the composite mask layer to define a trench area. Portions of the composite mask layer and the substrate are then removed using the photoresist layer as an etching mask, thereby forming a trench in the substrate. An isolation oxide layer is conformally formed on the composite mask layer, the sidewalls of the trench, and a bottom of the trench. Further, an undoped polysilicon layer is conformally formed on the isolation oxide layer. Thereafter, a doped polysilicon layer is formed over the undoped polysilicon layer, thereby filling the trench. The doped polysilicon layer is etched back using a first etchant, using the undoped polysilicon layer as an etch stop. The doped polysilicon layer and the undoped polysilicon layer are further etched back using a second etchant different from the first etchant, thereby forming a flat plug, where the second etchant has the same etch rate to both the undoped polysilicon layer and the doped polysilicon layer. Finally, the undoped polysilicon and the doped polysilicon layer are annealed to diffuse dopants of the doped polysilicon layer into the undoped polysilicon layer.

11 Claims, 9 Drawing Sheets

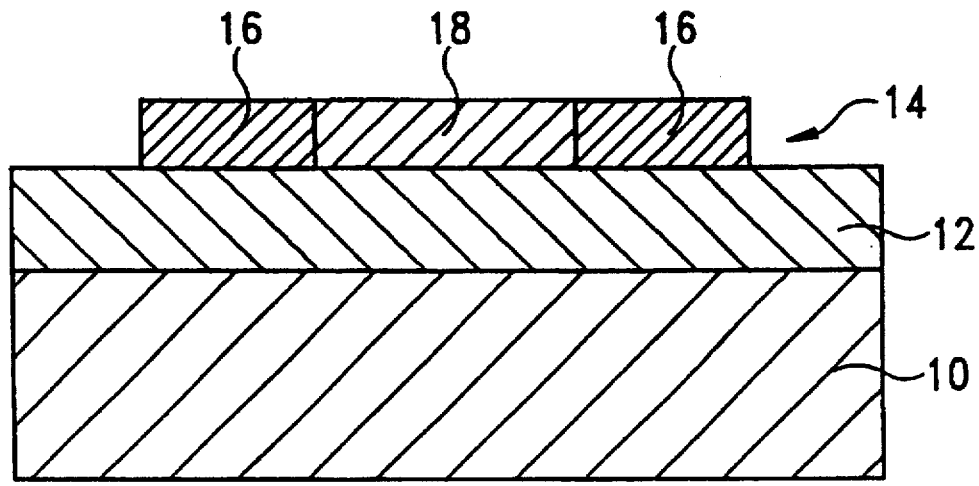
FIG. 1
(Prior Art)
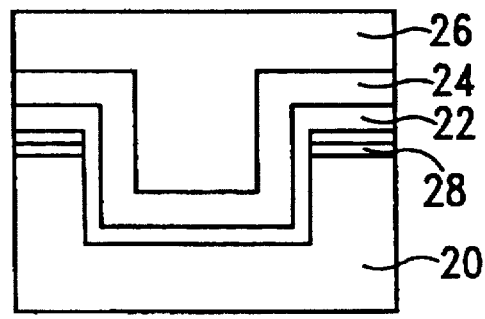
FIG. 2A
(Prior Art)
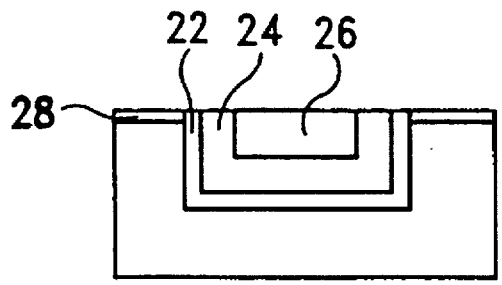 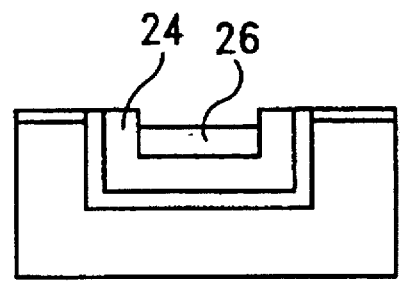
FIG. 2B
(Prior Art)
FIG. 2C
(Prior Art)

METHOD OF FABRICATING A RESISTOR IN AN INTEGRATED CIRCUIT

FIELD OF THE INVENTION

The present invention relates to a method of fabricating multi-valued resistors in an integrated circuit.

DESCRIPTION OF THE PRIOR ART

Multi-valued linear resistors are required in integrated circuits like static random access memories (SRAMs) or programmable read only memories (PROMs). FIG. 1 shows a cross sectional view of a conventional resistor in an integrated circuit. A polysilicon layer 14 is doped and patterned over a field oxide 12 and a silicon substrate 10. Two ion implants with different amounts of dopants are performed on the polysilicon layer 14 to provide a resistive portion 18 having a desired resistance, and two heavily-doped end regions 16 as contact electrodes. Separate photoengraving and masking steps are therefore required for each ion implant. Moreover, in order to fabricate multi-valued linear resistors on an integrated circuit, multiple photoengraving and masking steps are required to provide different resistance in the resistive portion of each resistor.

U.S. Pat. No. 5,352,923 entitled "Trench Resistors for Integrated Circuits" to Boyd et. al. discloses a method for forming multi-valued linear resistors for an integrated circuit using a single mask. FIGS. 2A to 2B show cross sectional views illustrating two steps of a process for forming a resistor according to the '923 patent. Referring to FIG. 2A, a conformal oxide layer 22 lines sidewalls and a bottom of a trench formed in a substrate 20. Next, a conformal undoped polysilicon layer 24 is formed on the oxide layer 22. A heavily-doped thick polysilicon layer 26 is deposited to fill the undoped- polysilicon-lined trench.

Subsequently, referring to FIG. 2B, a chemical-mechanical polishing method is applied to etch back portions of the heavily-doped thick polysilicon layer 26, the undoped polysilicon layer 24, and the oxide layer 22 until a silicon nitride layer 28 is reached. However, in the etching back process mentioned above, it is practically difficult to control the polishing due to the different materials encountered to achieve the desired structure of FIG. 2B. Furthermore, the polishing process incurs substantial damage to the surface of the structure shown in FIG. 2B, which further requires some corrective measures.

Another way to achieve the structure of FIG. 2B is the use of a conventional etch method. Unfortunately, this type of etch method usually results in a structure as shown in FIG. 2C, where the surface of the structure is not flat due to the different etching rate for the heavily doped thick polysilicon layer 26 and the undoped polysilicon layer 24.

SUMMARY OF THE INVENTION

A method of fabricating a resistor in an integrated circuit is disclosed. The method comprises the steps of forming a pad oxide layer on the substrate; forming a silicon oxide layer on said pad oxide layer; forming a silicon nitride layer on said silicon oxide layer; forming a photoresist layer on the silicon nitride layer, said photoresist layer defining a trench area on said silicon nitride layer; removing portions of said pad oxide layer, said silicon oxide layer, said silicon nitride layer and the substrate using said photoresist layer as a mask, thereby forming a trench in the substrate; conformally forming an isolation oxide layer on the silicon nitride layer, the sidewalls of the trench, and a bottom of the trench; conformally forming an undoped polysilicon layer on said isolation oxide layer; forming a doped polysilicon layer over said undoped polysilicon layer, thereby filling the trench; etching hack said doped polysilicon layer using etchant $SF_6$, said undoped polysilicon layer being an etch stop; etching hack said doped polysilicon layer and said undoped polysilicon layer using etchant $CF_x$, thereby forming a plug comprising said doped polysilicon layer and said undoped polysilicon layer, said plug having a flat surface, and the etchant $CF_x$ having the same etch rate to both said undoped polysilicon layer and said doped polysilicon layer; and annealing said undoped polysilicon and said doped polysilicon layer, thereby diffusing dopants of said doped polysilicon layer into said undoped polysilicon layer.

BRIEF DESCRIPTION OF THE DRAWINGS

FIG. 1 shows a cross sectional view of a conventional resistor in an integrated circuit;

FIGS. 2A to 2C show cross sectional views illustrating two steps of a prior art process for forming a resistor in an integrated circuit;

DESCRIPTION OF THE PREFERRED EMBODIMENT

Figure 3:
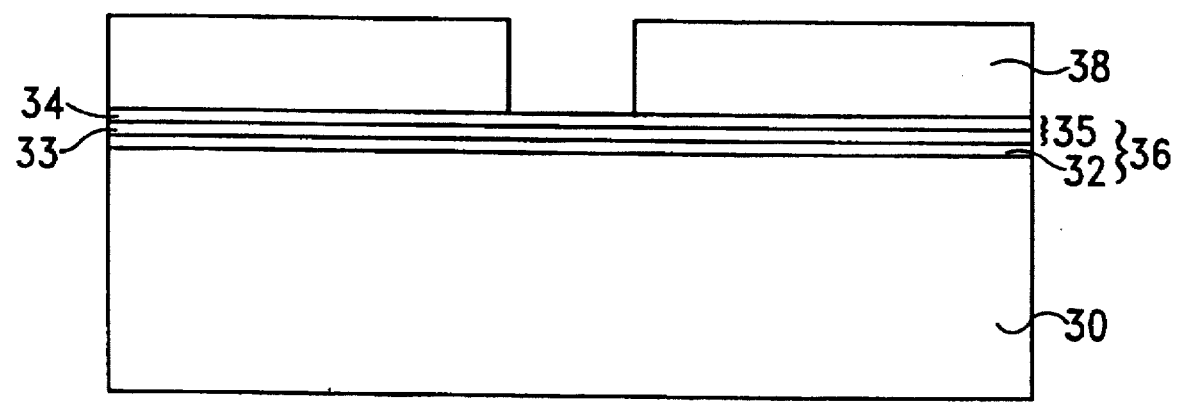
FIGS. 3 to 9 show cross-sectional views illustrative of various stages in the fabrication of a resistor in an integrated circuit in accordance with one embodiment of the present invention.

Referring to FIG. 3, a pad oxide layer 32 is conventionally formed on a substrate 30. This pad oxide layer 32 is formed using a thermal oxidation process at a temperature of about 900°~1100° C. The pad oxide layer 32 can be alternatively formed by a chemical vapor deposition method, typically to a thickness of about 200 to 600 angstroms. A composite layer 35 is then subsequently formed on the pad oxide layer 32, and the thickness of the composite layer 35 is about 800~3000 angstroms.

This composite layer 35 can be provided by a single silicon oxide layer 33 and a coating of a silicon nitride layer 34. In this embodiment, a CVD process is used to form the silicon oxide layer 33 to a thickness of about 500~2000 angstroms, and a CVD process is used to deposit the silicon nitride layer 34 to a thickness of about 300~1000 angstroms. The pad oxide layer 32, the silicon oxide layer 33, and the silicon nitride layer 34 mentioned above together serve as a masking layer 36 in forming a trench, which will be described below. It is appreciated that the masking layer 36 may include only a single silicon oxide layer 33 or only a composite layer 35.

Figure 4:
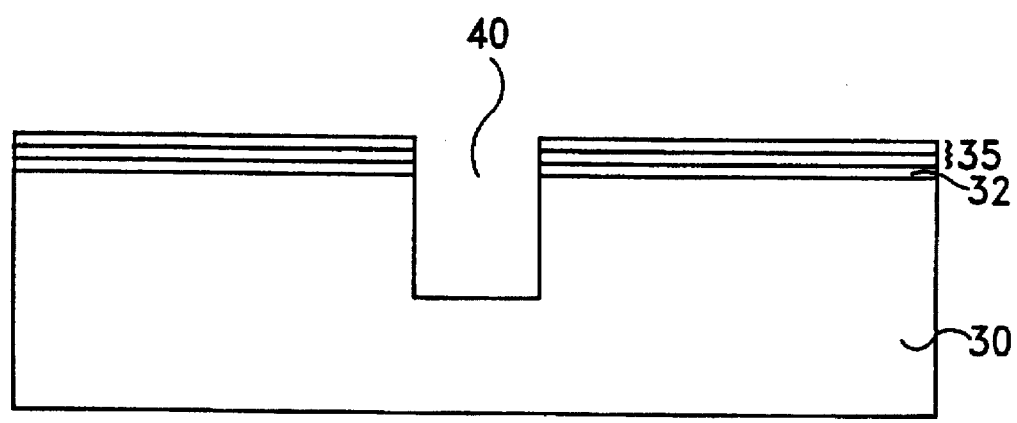

Next, conventional photolithography techniques are then used to define a trench area on the silicon nitride layer 34 using a photoresist 38. The composite layer 35, the pad oxide layer 32, and the substrate 30 are then anistropically etched using the composite layer 35 as an etching mask, forming a deep, steep-sided trench 40 in the substrate 30 as shown in FIG. 4. In this embodiment, a MERIE process with a $HBr/CL_2$ etchant is used to form this trench 40.

Figure 5:
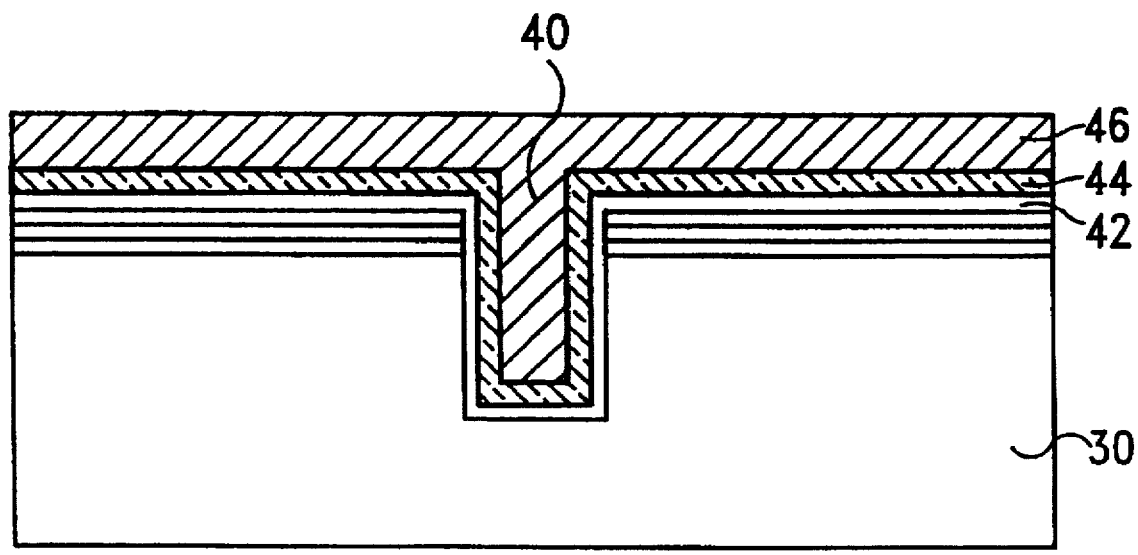

Referring to FIG. 5, a conformal and undoped oxide layer 42 is deposited to line the silicon nitride layer 34, the sidewalls of the trench 40, and the bottom of the trench 40. In this embodiment, the oxide layer 42 is preferably formed using a conventional chemical vapor deposition process, to a thickness of about 500~2000 angstroms. The oxide layer 42 acts as an isolation layer between the substrate 30 and a resistive portion inside the trench 40. Next, a conformal and undoped polysilicon layer 44 is deposited on the oxide layer 42, lining the trench 40 in the oxide-lined substrate 30. In this embodiment, a low pressure chemical vapor deposition process is used to form the undoped polysilicon layer 44 by reacting silane ($SiH_4$) and nitrogen ($N_2$) at about 575° C. The thickness of the undoped polysilicon layer 44 can be between 500 to 2000 angstroms. Next, a heavily-doped polysilicon layer 46 is subsequently deposited over the undoped polysilicon layer 44, thereby filling the trench 40. In this embodiment, the heavily-doped polysilicon layer 46 is formed by a conventional method of polysilicon chemical vapor deposition with in situ doping of phosphorus (P) or arsenic (As) dopants at a concentration of about 5E20~1E21 atoms/$cm^2$ by reacting $PH_3$, silane, and nitrogen at about 575° C.

Figure 6:
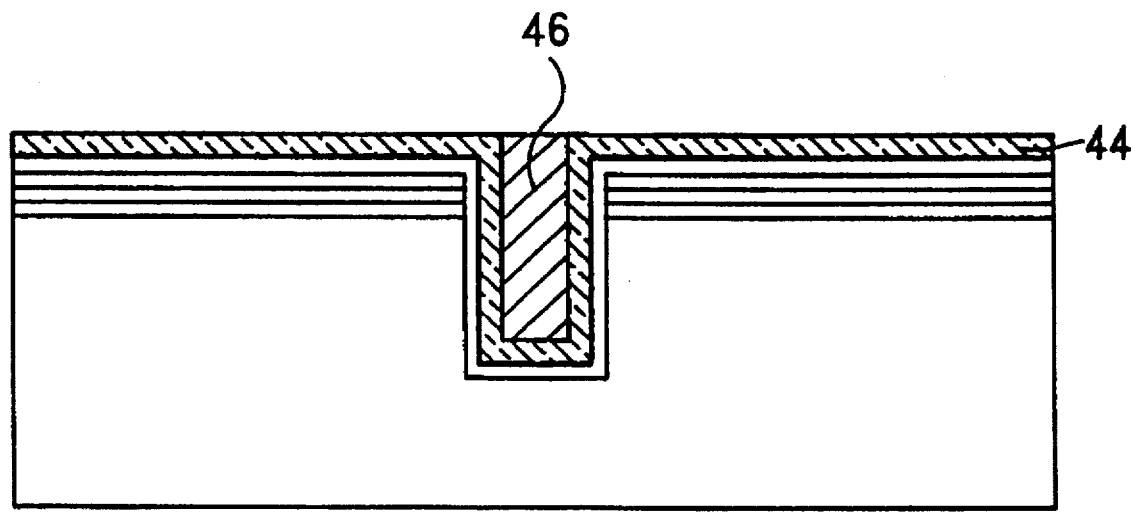

The structure of FIG. 5 is then subject to a first etch back process using the undoped polysilicon layer 44 as an etching stop, resulting in the structure shown in FIG. 6. In this embodiment, a reactive ion etch method with etchant $SF_6$ is preferably used owing to the large selectivity of the heavily-doped polysilicon layer 46 to the undoped polysilicon layer 44 for the etchant $SF_6$.

Next, a second etch back process is performed to etch portions of the undoped polysilicon layer 44 and the heavily-doped polysilicon layer 46 to form a flat plug 45, which includes the heavily-doped polysilicon layer 46 and the undoped polysilicon layer 44. The etchant used in this second etch back process is specifically chosen so that the heavily-doped polysilicon layer 46 and the undoped polysilicon layer 44 have the same etch rate. In this embodiment, a reactive ion etch method with etchant $CF_x$ (for example $CF_4$) is preferably used. It is noted that two etch back steps are required instead of using $CF_x$ in a single step because $CF_x$ is not a very fast etchant of polysilicon. Therefore, it would take too long to etch away the relative thick doped polysilicon 46 (FIG. 5) if only one etch step with etchant $CF_x$ is used.

Figure 7:
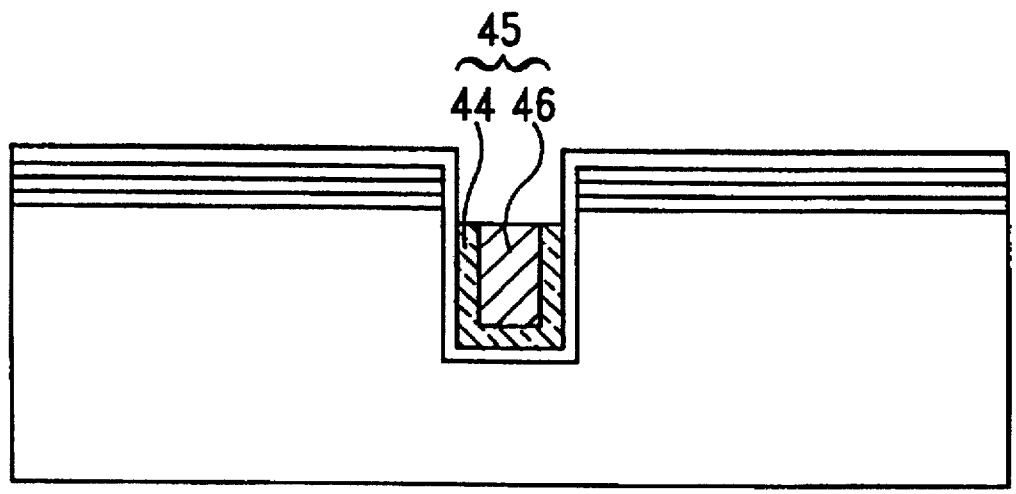
Figure 8:
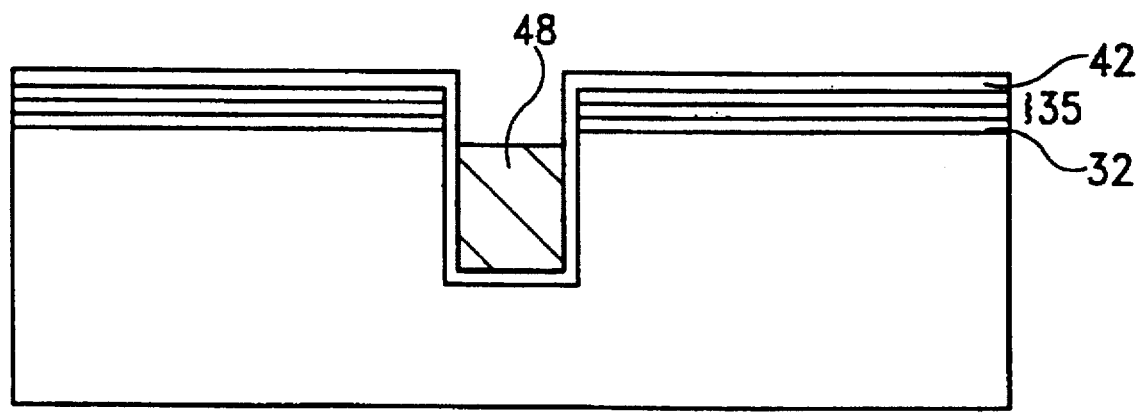

The structure of FIG. 7 is thereafter subjected to an annealing process to diffuse dopants from the doped polysilicon layer 46 into the undoped polysilicon layer 44, resulting in the resistive portion 48 as shown in FIG. 8. In this embodiment, annealing is carried out at about 800°~1000° C.

The resistivity of the resistive portion 48 is related to the mount of dopants in the doped polysilicon layer 46 (FIG. 7) and to the width of the plug 45 (FIG. 7). The wider the plug 45, the lower the resistance of the resistive portion 48. Thus, the process allows for simultaneously forming resistors of different values, using only one mask to define the trenches of different dimensions. The requirements for multiple photoengraving and implantation steps to conventionally form multi-valued resistors on an integrated circuit as described in connection with FIG. 1 is avoided. The non-flat surface of the conventional plug in connection with FIG. 2C is also avoided.

Figure 9:
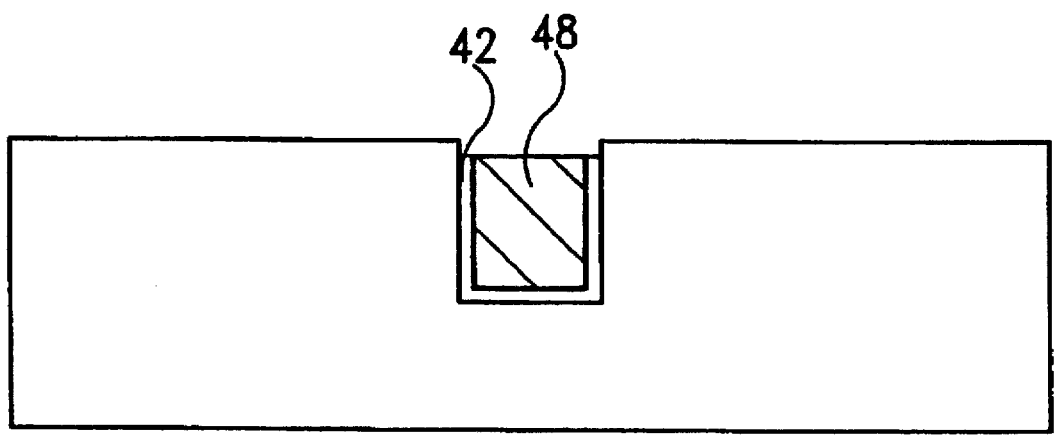
Figure 10A:
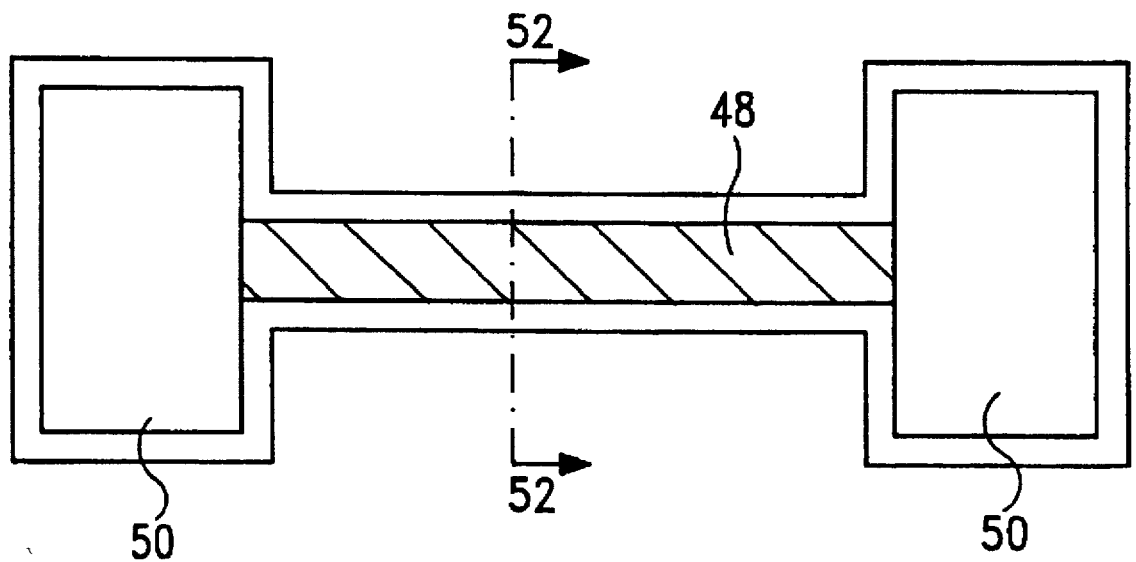
FIGS. 10A and 10B show the plan views of the surface of two resistor structures in accordance with the present invention.

Finally, portions of the oxide layer 42, the composite layer 35, and the pad oxide layer 32 are removed, for example, using conventional plasma or wet etching process, resulting in the resistive portion 48 surrounded by the isolation oxide layer 42 as shown in FIG. 9. A plan view of the surface of the resistor structure is shown in FIG. 10A, where the resistor includes an elongated resistive portion 48, and two conductive contact portions 50. FIGS. 3 to 9 show cross sectional views in the along axis 52.

Figure 10B:
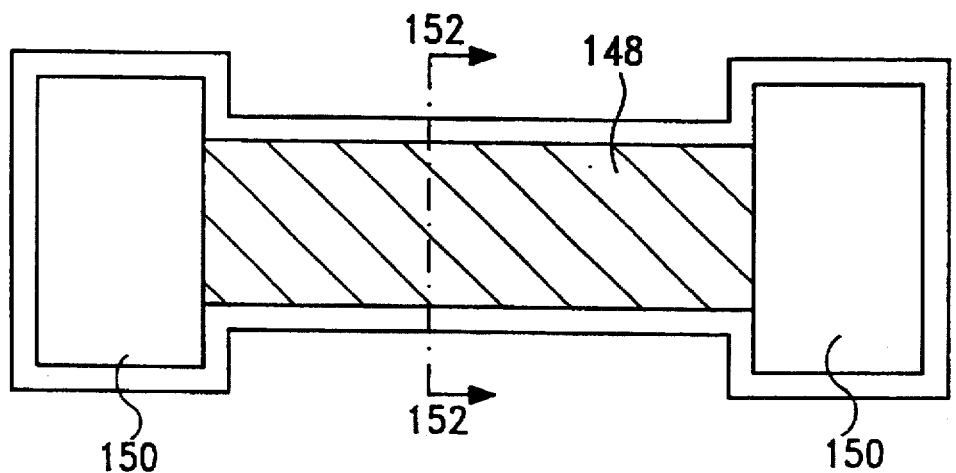

FIG. 10B shows the plan view of another resistor, which has lower resistance than the resistor of FIG. 10A due to its wider lateral dimension. The resistor includes an elongated resistive portion 148, and two conductive contact portions 150. Cross sectional views in the axis 152 are shown in FIG. 11 to 17, and will be briefly described below.

Figure 11:
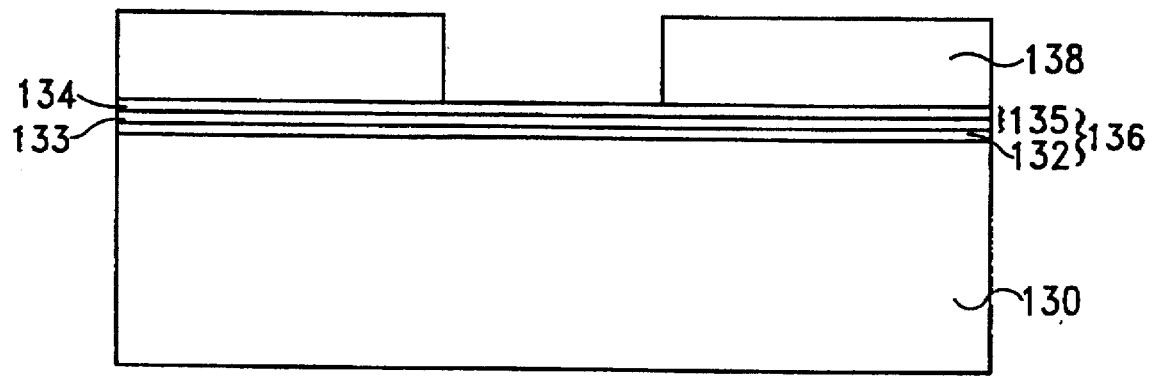
FIGS. 11 to 17 show cross-sectional views illustrative of various stages in the fabrication of a resistor in an integrated circuit in accordance with another embodiment of the present invention.

Referring to FIG. 11, a pad oxide layer 132 is conventionally formed on a substrate 130 using a thermal oxidation process or a chemical vapor deposition method, typically to a thickness of about 200 to 600 angstroms. A composite layer 135 is subsequently formed on the pad oxide layer 132. This composite layer 135 can be provided by a single silicon oxide layer 133 and a coating of a silicon nitride layer 134. The pad oxide layer 132, the silicon oxide layer 133, and the silicon nitride layer 134 mentioned above together serve as a masking layer 136 in forming a trench, which will be described below. It is appreciated that the masking layer 136 may include only a single silicon oxide layer 133 or only a composite layer 135.

Figure 12:
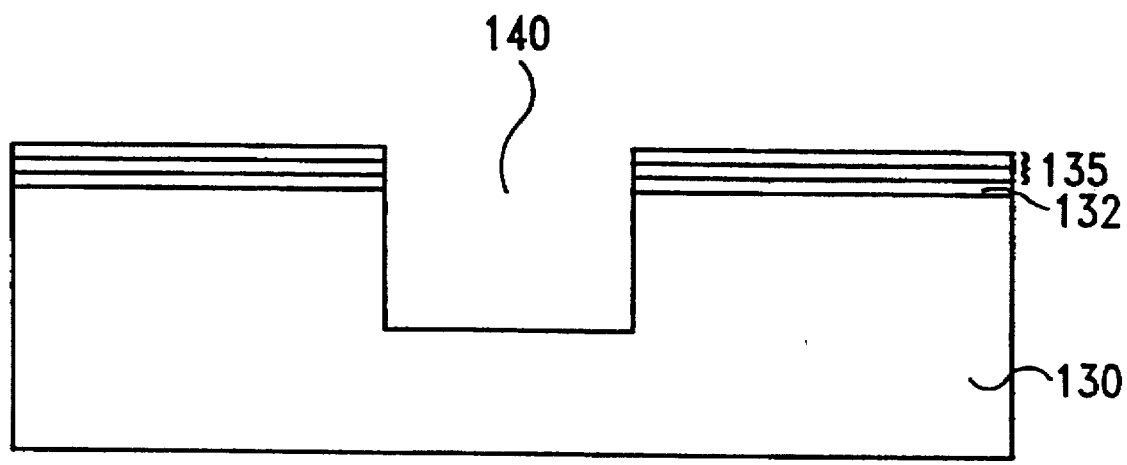

Next, conventional photolithography techniques are then used to define a trench area on the silicon nitride layer 134 using a photoresist 138. The composite layer 135, the pad oxide layer 132, and the substrate 130 are then anistropically etched using the composite layer 135 as an etch mask, forming a deep, steep-sided trench 140 in the substrate 130 as shown in FIG. 12.

Figure 13:
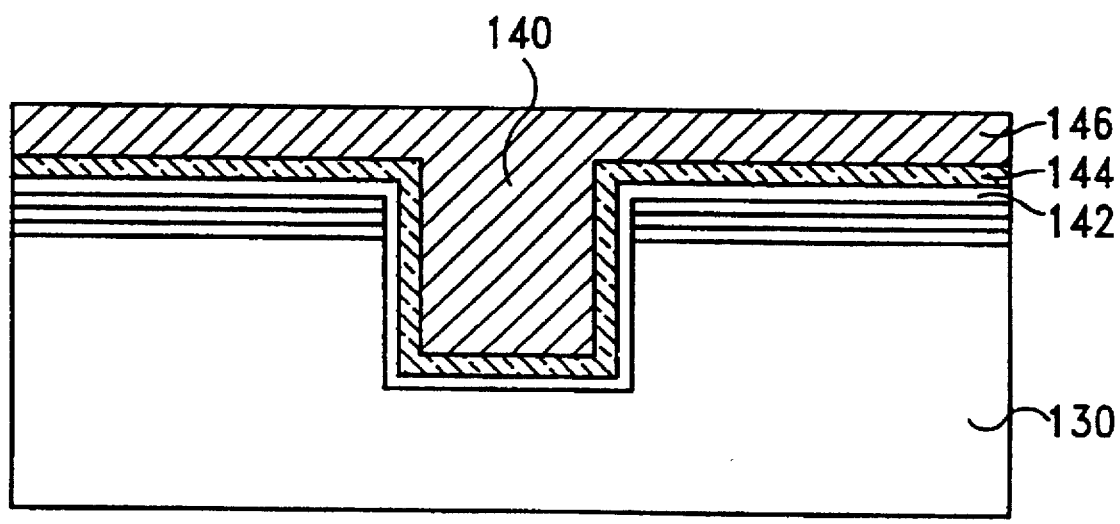

Referring to FIG. 13, a conformal and undoped oxide layer 142 is deposited to line the silicon nitride layer 134, the sidewalls of the trench 140, and the bottom of the trench 140. The oxide layer 142 acts as an isolation layer between the substrate 130 and a resistive portion inside the trench 140. Next, a conformal and undoped polysilicon layer 144 is deposited on the oxide layer 142, lining the trench 140 in the oxide-lined substrate 130. A heavily-doped polysilicon layer 146 is subsequently deposited over the undoped polysilicon layer 144, thereby filling the trench 140.

Figure 14:
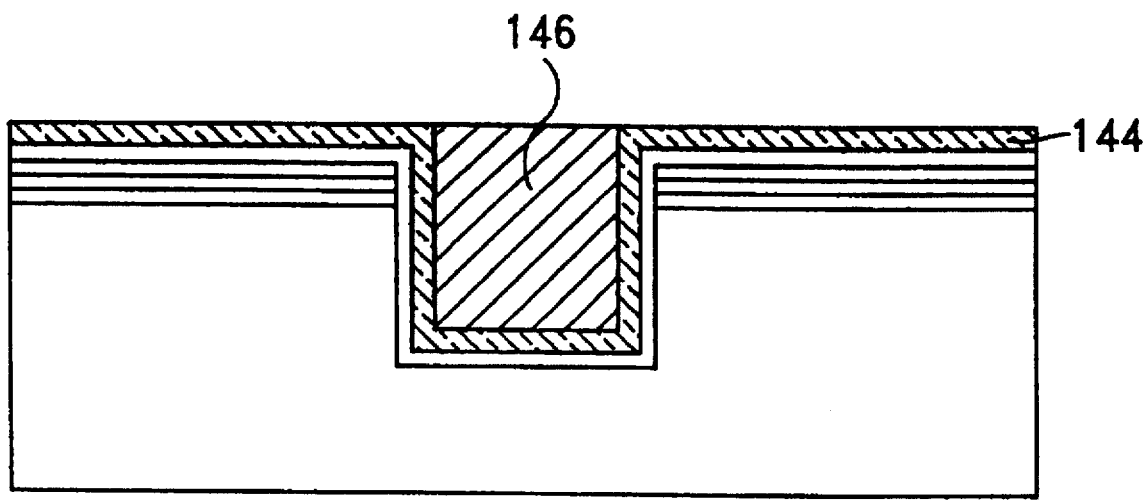

The structure of FIG. 13 is then subject to a first etch back process using the undoped polysilicon layer 144 as an etching stop, resulting in the structure shown in FIG. 14. In this embodiment, a reactive ion etch method with etchant $SF_6$ is preferably used owing to the large selectivity of the heavily-doped polysilicon layer 146 to the undoped polysilicon layer 144 for the etchant $SF_6$.

Next, a second etch back process is performed to etch portions of the undoped polysilicon layer 144 and the heavily-doped polysilicon layer 146 to form a flat plug 145, which includes the heavily-doped polysilicon layer 146 and the undoped polysilicon layer 144. The etchant used in this second etch back process is specifically chosen so that the heavily-doped polysilicon layer 146 and the undoped polysilicon layer 144 have the same etch rate. In this embodiment, a reactive ion etch method with etchant $CF_x$ (for example $CF_4$) is preferably used.

Figure 15:
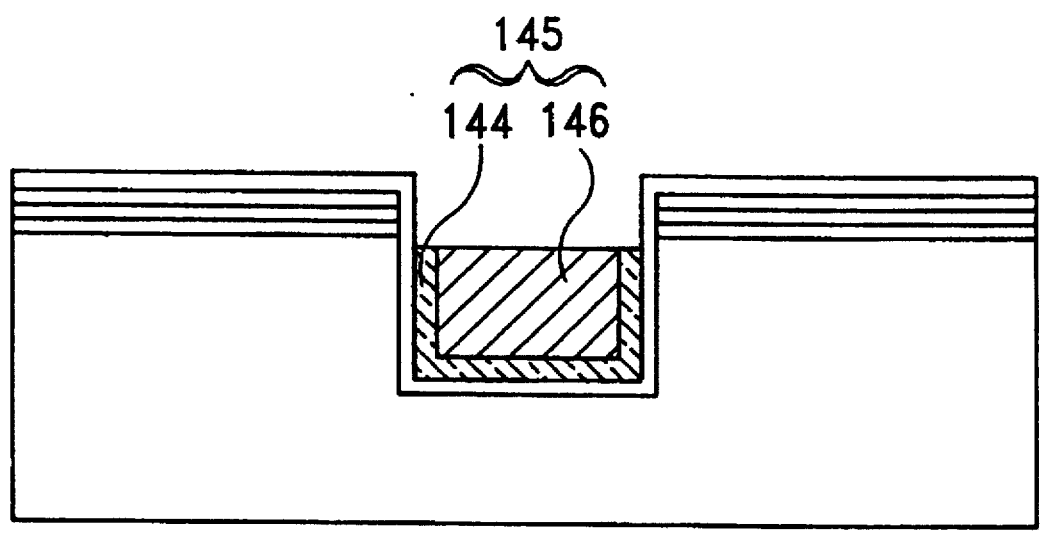
Figure 16:
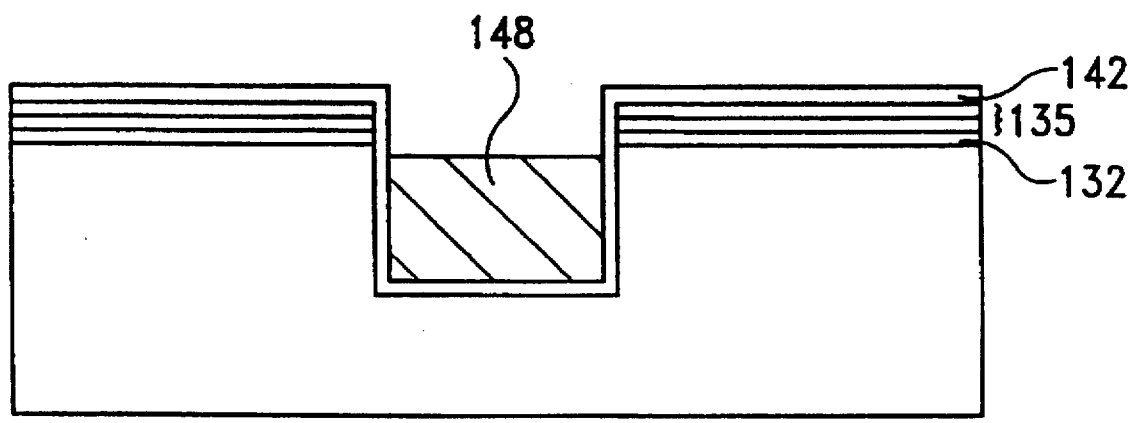

The structure of FIG. 15 is thereafter subject to an annealing process to diffuse dopants from the doped polysilicon layer 146 into the undoped polysilicon layer 144, resulting in the resistive portion 148 as shown in FIG. 16. The resistivity of the resistive portion 148 is related to the mount of dopants in the doped polysilicon layer 146 (FIG. 15) and to the width of the plug 145 (FIG. 15). The wider the plug 145, the lower the resistance of the resistive portion 148. Thus, the process allows for the simultaneous forming of resistors of different values, using only one mask to define the trenches of different dimensions. The requirements for multiple photoengraving and implantation steps to conventionally form multi-valued resistors on an integrated circuit as described in connection with FIG. 1 is avoided. The non-flat surface of the conventional plug in connection with FIG. 2C is also avoided.

Figure 17:
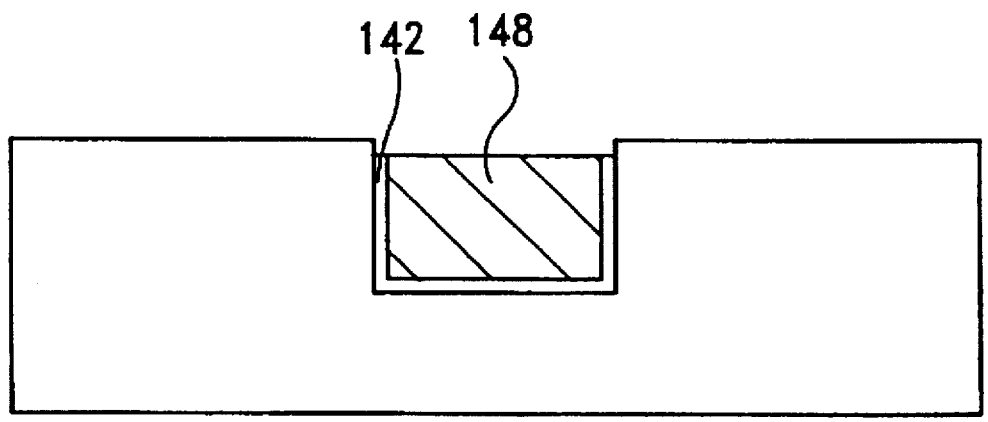

Finally, portions of the oxide layer 142, the composite layer 135, and the pad oxide layer 132 are removed, for example, using a conventional MERIE process, resulting in the resistive portion 148 surrounded by the isolation oxide layer 142 as shown in FIG. 17.

Although specific embodiments have been illustrated and described, it will be obvious to those skilled in the art that various modifications may be made without departing from the spirit which is intended to be limited solely by the appended claims.

What is claimed is:

1. A method of fabricating a resistor in an integrated circuit, said method comprising the steps of:

forming a composite mask layer on a substrate;

forming a photoresist layer on the composite mask layer, said photoresist layer defining a trench area on said composite mask layer;

removing portions of said composite mask layer and the substrate using said photoresist layer as a mask, thereby forming a trench in the substrate;

conformally forming an isolation oxide layer on the composite mask layer, the sidewalls of the trench, and a bottom of the trench;

conformally forming an undoped polysilicon layer on said isolation oxide layer;

forming a doped polysilicon layer over said undoped polysilicon layer, thereby filling the trench;

etching back said doped polysilicon layer using a first etchant, said undoped polysilicon layer being an etch stop;

etching back said doped polysilicon layer and said undoped polysilicon layer using a second etchant different from the first etchant, thereby forming a plug comprising said doped polysilicon layer and said undoped polysilicon layer, said plug having a flat surface, and the second etchant having the same etching rate to both said undoped polysilicon layer and said doped polysilicon layer; and annealing said undoped polysilicon and said doped polysilicon layer, thereby diffusing dopants of said doped polysilicon layer into said undoped polysilicon layer.

2. The method according to claim 1, further comprising the steps of:

removing a portion of said isolation oxide layer until the surface of the plug is reached; and removing said composite mask layer.

3. The method according to claim 1, wherein the step of forming said composite mask layer comprises:

forming a pad oxide layer on the substrate;

forming a silicon oxide layer on said pad oxide layer; and forming a silicon nitride layer on said silicon oxide layer.

4. The method according to claim 1, wherein the thickness of said undoped polysilicon layer is about 500–2000 angstroms.

5. The method according to claim 1, wherein the concentration of said doped polysilicon layer is about 5E20–1E21 atoms/cm$^2$.

6. The method according to claim 1, wherein said first etchant comprises $SF_6$.

7. The method according to claim 1, wherein said second etchant comprises $CF_4$.

8. A method of fabricating a resistor in an integrated circuit, said method comprising:

forming a pad oxide layer on a substrate;

forming a silicon oxide layer on said pad oxide layer;

forming a silicon nitride layer on said silicon oxide layer;

forming a photoresist layer on the silicon nitride layer, said photoresist layer defining a trench area on said silicon nitride layer;

removing portions of said pad oxide layer, said silicon oxide layer, said silicon nitride layer and the substrate using said photoresist layer as a mask, thereby forming a trench in the substrate;

conformally forming an isolation oxide layer on the silicon nitride layer, the sidewalls of the trench, and a bottom of the trench;

conformally forming an undoped polysilicon layer on said isolation oxide layer;

forming a doped polysilicon layer over said undoped polysilicon layer, thereby filling the trench;

etching back said doped polysilicon layer using etchant $SF_6$, said undoped polysilicon layer being an etch stop;

etching back said doped polysilicon layer and said undoped polysilicon layer using etchant $CF_4$, thereby forming a plug comprising said doped polysilicon layer and said undoped polysilicon layer, said plug having a flat surface, and the etchant $CF_4$ having the same etch rate to both said undoped polysilicon layer and said doped polysilicon layer; and annealing said undoped polysilicon and said doped polysilicon layer, thereby diffusing dopants of said doped polysilicon layer into said undoped polysilicon layer.

9. The method according to claim 8, further comprising the steps of:

removing portion of said isolation oxide layer until the surface of the plug is reached; and removing said silicon nitride layer, said silicon oxide layer, and said pad oxide layer.

10. The method according to claim 8, wherein the thickness of said undoped polysilicon layer is about 500–2000 angstroms.

11. The method according to claim 8, wherein the concentration of said doped polysilicon layer is about 5E20–1E21 atoms/cm$^2$.

* * * * *